United States Patent
Nordman et al.

(10) Patent No.: US 7,634,704 B2
(45) Date of Patent: Dec. 15, 2009

(54) ENCODING METHOD, TRANSMITTER, NETWORK ELEMENT AND COMMUNICATION TERMINAL

(75) Inventors: Risto Nordman, Oulu (FI); Mauri Nissilä, Oulu (FI)

(73) Assignee: Nokia Corporation, Espoo (FI)

( * ) Notice: Subject to any disclaimer, the term of this patent is extended or adjusted under 35 U.S.C. 154(b) by 608 days.

(21) Appl. No.: 11/400,312

(22) Filed: Apr. 10, 2006

(65) Prior Publication Data
US 2007/0245212 A1    Oct. 18, 2007

(30) Foreign Application Priority Data
May 25, 2005    (FI) ................... 20055248

(51) Int. Cl.
*H03M 13/00* (2006.01)
(52) U.S. Cl. .................. 714/755; 714/786; 341/67
(58) Field of Classification Search .......... 714/758, 714/781, 782, 777, 779, 755, 786; 341/67
See application file for complete search history.

(56) References Cited

U.S. PATENT DOCUMENTS

2001/0050622 A1   12/2001   Hewitt et al. .......... 341/50
2002/0147954 A1   10/2002   Shea
2004/0199847 A1*  10/2004   Calabro et al. ......... 714/755

FOREIGN PATENT DOCUMENTS

EP    1225705    12/2001

OTHER PUBLICATIONS

A. Hunt, et al.; "Hyper-Codes: High-Performance, Low-Complexity Codes"; 2000; pp. 121-124 XP 002510703.
A. Hunt, et al.; "Hyper-Codes: High-Performance Low-Complexity Error-Correcting Codes"; 1998; pp. 1-5 XP 002570704.
A. W. Hunt; "Hyper-Codes: High-Performance Low-Complexity Error-Correcting Codes"; 1998; whole document XP-002510705.
European Search Report, PCT/FI2006050202 dated Jan. 30, 2009.

* cited by examiner

*Primary Examiner*—Guy J Lamarre
(74) *Attorney, Agent, or Firm*—Mintz, Levin, Cohn, Ferris, Glvosky and Popeo, P.C.

(57) ABSTRACT

The invention relates arranging information bits in an information matrix; encoding rows of the information matrix for generating a base code matrix; generating a parity check row for the base code matrix to obtain an extended code matrix; shifting predetermined rows of the extended code matrix with respect to a preceding row in a predetermined way and generating a following parity check row for obtaining a following extended code matrix in such a way that there are more than two parity check rows in the following extended code matrix; and derotating the rows of the following extended code matrix for generating a multiple parity code matrix.

26 Claims, 2 Drawing Sheets

ENCODING METHOD, TRANSMITTER, NETWORK ELEMENT AND COMMUNICATION TERMINAL

FIELD

The invention relates to an encoding method, a transmitter, a network element and a communication terminal.

BACKGROUND

The need for coding arises from the large volume of data communicated or stored in communication systems. Transmissions in communication systems are usually quite intolerant to interference due to the interest of using the spectrum as efficiently as possible. Therefore coding is required to ensure proper performance. Coding is needed in encryption as well.

In an encoder, a data sequence is transformed into another sequence. Typically, the new sequence is longer having more redundancy than the original data sequence. Each symbol in the new coded sequence may be represented by a group of bits.

The error probability of a code is mainly determined by a distance spectrum of the code. For linear codes, the distance spectrum is the same as a weight spectrum. At a low bit error rate (BER), the smallest weight and its multiplicity (number of code words having the smallest weight) tends to determine the performance of a code. Hence, a code that has a large minimum Hamming distance gives the best performance at a low BER.

In one prior art code, a parity row is added into an extended Hamming product code matrix. The code is described in US 2001/0050622 A1, which is taken herein as a reference. However, it has been noticed in simulations that it is difficult to predict the effects of the added parity row, which makes the designing of the best possible code with the desired Hamming distance laborious.

BRIEF DESCRIPTION OF THE INVENTION

According to an aspect of the invention, there is provided an encoding method comprising: arranging information bits in an information matrix encoding rows of the information matrix for generating a base code matrix; generating a parity check row for the base code matrix to obtain an extended code matrix; shifting predetermined rows of the extended code matrix with respect to a preceding row in a predetermined way and generating a following parity check row for obtaining a following extended code matrix in such a way that there are more than two parity check rows in the following extended code matrix; derotating the rows of the following extended code matrix for generating a multiple parity code matrix.

According to another aspect of the invention, there is provided a component comprising: means for arranging information bits in an information matrix; means for encoding rows of the information matrix for generating a base code matrix; means for generating a parity check row for the base code matrix to obtain an extended code matrix; means for shifting predetermined rows of the extended code matrix with respect to a preceding row in a predetermined way and generating a following parity check row for obtaining a following extended code matrix in such a way that there are more than two parity check rows in the following extended code matrix; and means for derotating the rows of the following extended code matrix for generating a multiple parity code matrix.

According to another aspect of the invention, there is provided a network element comprising: means for arranging information bits in an information matrix; means for encoding rows of the information matrix for generating a base code matrix; means for generating a parity check row for the base code matrix to obtain an extended code matrix; means for shifting predetermined rows of the extended code matrix with respect to a preceding row in a predetermined way and generating a following parity check row for obtaining a following extended code matrix in such a way that there are more than two parity check rows in the following extended code matrix; means for derotating the rows of the following extended code matrix for generating a multiple parity code matrix and means for adapting an encoded signal for a radio path According to another aspect of the invention, there is provided a communication terminal comprising: means for arranging information bits in an information matrix; means for encoding rows of the information matrix for generating a base code matrix; means for generating a parity check row for the base code matrix to obtain an extended code matrix; means for shifting predetermined rows of the extended code matrix with respect to a preceding row in a predetermined way and generating a following parity check row for obtaining a following extended code matrix in such a way that there are more than two parity check rows in the following extended code matrix; means for derotating the rows of the following extended code matrix for generating a multiple parity code matrix and means for adapting an encoded signal for a radio path.

According to another aspect of the invention, there is provided a component, configured to: arrange information bits in an information matrix; encode rows of the information matrix for generating a base code matrix; generate a parity check row for the base code matrix to obtain an extended code matrix; shift predetermined rows of the extended code matrix with respect to a preceding row in a predetermined way and generating a following parity check row for obtaining a following extended code matrix in such a way that there are more than two parity check rows in the following extended code matrix; and derotate the rows of the following extended code matrix for generating a multiple parity code matrix.

According to another aspect of the invention, there is provided a network element, configured to: arrange information bits in an information matrix; encode rows of the information matrix for generating a base code matrix; generate a parity check row for the base code matrix to obtain an extended code matrix; shift predetermined rows of the extended code matrix with respect to a preceding row in a predetermined way and generating a following parity check row for obtaining a following extended code matrix in such a way that there are more than two parity check rows in the following extended code matrix; derotate the rows of the following extended code matrix for generating a multiple parity code matrix and adapt an encoded signal for a radio path.

According to another aspect of the invention, there is provided a communication terminal, configured to: arrange information bits in an information matrix; encode rows of the information matrix for generating a base code matrix; generate a parity check row for the base code matrix to obtain an extended code matrix; shift predetermined rows of the extended code matrix with respect to a preceding row in a predetermined way and generating a following parity check row for obtaining a following extended code matrix in such a way that there are more than two parity check rows in the following extended code matrix; derotate the rows of the following extended code matrix for generating a multiple parity code matrix and adapt an encoded signal for a radio path.

According to another aspect of the invention, there is provided a computer program product encoding a computer program of instructions for executing a computer process, the process configured to: arrange information bits in an information matrix; encode rows of the information matrix for generating a base code matrix; generate a parity check row for the base code matrix to obtain an extended code matrix; shift predetermined rows of the extended code matrix with respect to a preceding row in a predetermined way and generating a following parity check row for obtaining a following extended code matrix in such a way that there are more than two parity check rows in the following extended code matrix; and derotate rows of the following extended code matrix for generating a multiple parity code matrix.

Preferred embodiments of the invention are described in the dependent claims.

The method and system of the invention provide several advantages. In an embodiment of the invention, there is provided a code that is well-suited for low BER circumstances and easy to generate. Additionally, the performance of the code of the embodiment is in some circumstances remarkably better than the performance of the code disclosed in US 2001/0050622 A1.

LIST OF DRAWINGS

In the following, the invention will be described in greater detail with reference to the preferred embodiments and the accompanying drawings, in which FIG. 1 shows an example of a communication system;

DESCRIPTION OF EMBODIMENTS

Figure 1:
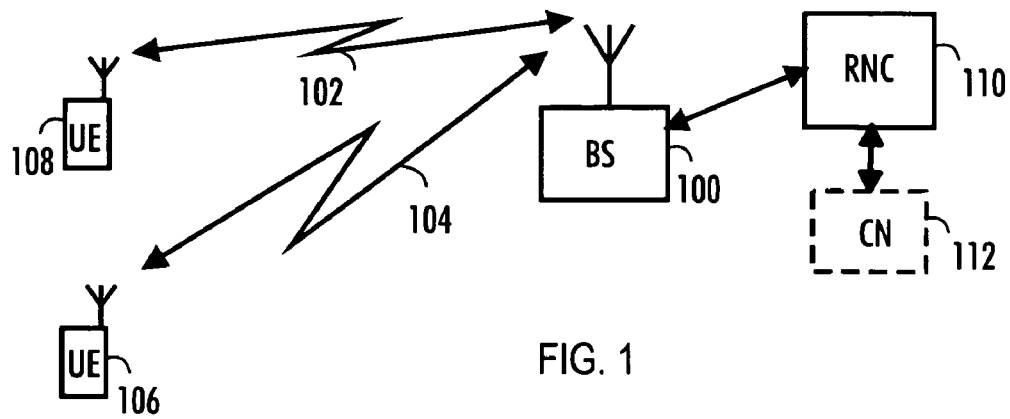

With reference to FIG. 1, we examine an example of a communication system to which embodiments of the invention can be applied. The present invention can be applied in various communication systems. One example of such a communication system is the Universal Mobile Telecommunications System (UMTS) radio access network. It is a radio access network which includes wideband code division multiple access (WCDMA) technology and can offer also real-time circuit and packet switched services. Another example is Global System for Mobile Communications (GSM). The embodiments are not, however, restricted to the systems given as examples but a person skilled in the art may apply the solution to other communication systems provided with the necessary properties.

It is clear to a person skilled in the art that the method according to the invention can be applied to systems utilizing different modulation methods or air interface standards.

FIG. 1 is a simplified illustration of a data transmission system to which the solution according to the invention is applicable. This is a part of a cellular radio system, which comprises a base station (or node B) 100, which has bi-directional radio links 102 and 104 to subscriber terminals 106 and 108. The subscriber terminals may be fixed, vehicle-mounted or portable. The base station includes transceivers, for instance. From the transceivers of the base station, there is a connection to an antenna unit that establishes the bi-directional radio links to the subscriber terminals. The base station is further connected to a controller 110, a radio network controller (RNC) or a base station controller (BSC), which transmits the connections of the terminals to the other parts of the network. The base station controller of the radio network controller controls in a centralized manner several base stations connected to it. The base station controller or the radio network controller is further connected to a core network 112 (CN). Depending on the system, the counterpart on the CN side can be mobile services switching centre (MSC), media gateway (MGW) or serving GPRS (general packet radio service) support node (SGSN) etc.

The cellular radio system can also communicate with other networks, such as a public switched telephone network or the Internet.

Next, an embodiment of the encoding method is explained in further detail. The new code class of turbo product (or block) codes according to the embodiment of the invention is called multiple parity check of cyclic codes (MPCC codes).

For the MPCC code, best distance properties (and hence best weight spectrum) can be obtained by using a horizontal code $C(n_1,k_1)$ that fulfils the following conditions: first, the code is linear, and second, the code is cyclic. The vertical code is typically a single parity check code.

Since any cyclic shifting of the cyclic codeword is also a cyclic codeword itself and any linear combination of linear cyclic codewords is also a linear cyclic codeword, all the parity check rows generated in the embodiment described above are also code words of the $C(n_1,k_1)$ code. Due to the cyclicality requirement, the code is called in this application multiple parity check of cyclic code, MPCC code.

Channel coding can be divided into two main groups: block coding and convolutional coding. With block coding, the source data sequence is segmented into blocks. The encoder then transforms the blocks into larger code blocks which include redundant bits. Redundant bits do not carry new information.

The class of cyclic codes is a sub-class of linear codes that in turn belong to the block code group. A cyclic code word, after cyclic shifts, has the property of remaining a valid code from the original set of code words. Cyclic codes can be encoded with feed-back shift registers. Known cyclic codes are, for instance, cyclic Hamming codes, Golay codes and Bose-Chaudhuri-Hocquenghem (BCH) codes.

A parity check code is used to detect (not correct) a single error. In a simple parity check code, for instance, when information includes k bits, a (k+1)th bit is added so as to make the total number of ones in a codeword even.

Figure 2:
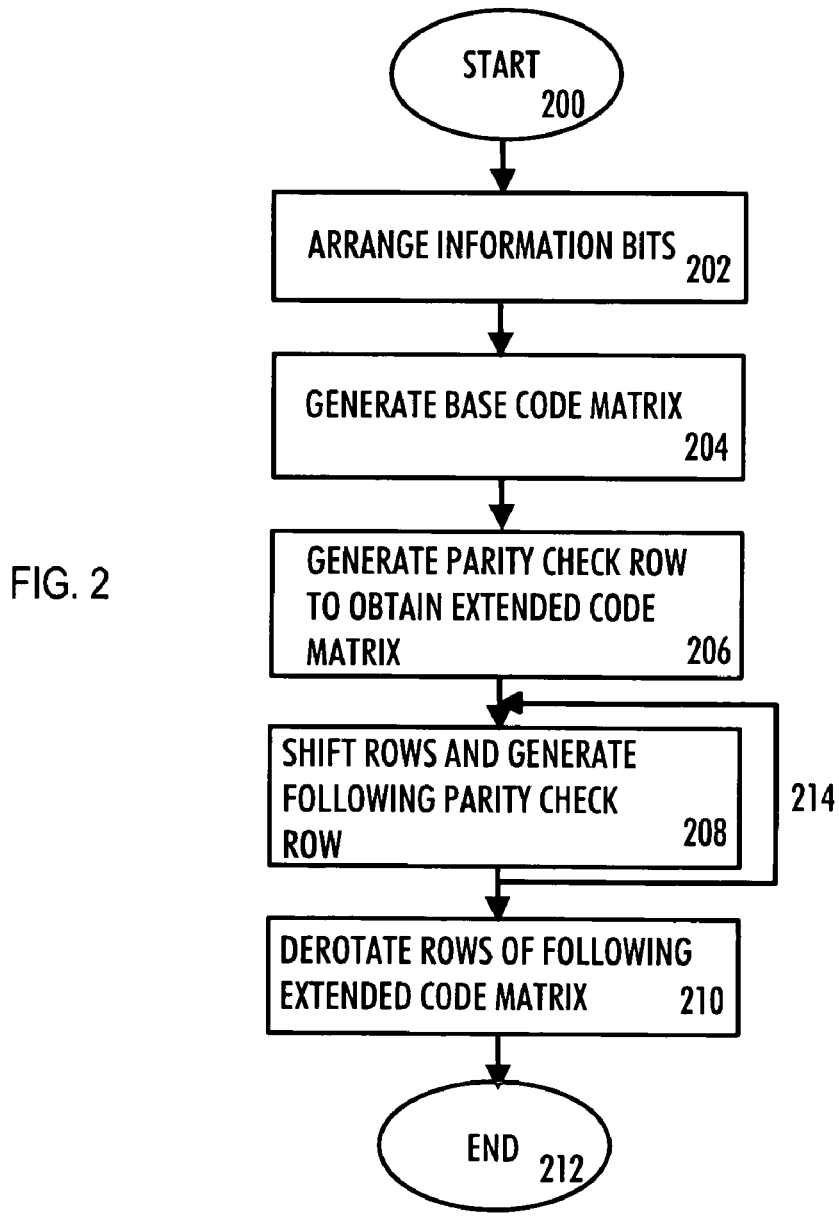
FIG. 2 is a flow chart.

By means of FIG. 2 an embodiment of the encoding of MPCC codes is explained below as a step-by-step process by using a simple example. It is obvious to a person skilled in the art that the example used to clarify the embodiment is only an example and that the matrixes can vary according to the practical implementation.

The embodiment starts in block 200.

In block 202, information bits are arranged into an information matrix. An example of such a matrix is shown below:

TABLE 1

| $b_1^{(1)}$ | $b_2^{(1)}$ | $b_3^{(1)}$ | $b_4^{(1)}$ |
| $b_1^{(2)}$ | $b_2^{(2)}$ | $b_3^{(2)}$ | $b_4^{(2)}$ |
| $b_1^{(3)}$ | $b_2^{(3)}$ | $b_3^{(3)}$ | $b_4^{(3)}$ |
| $b_1^{(4)}$ | $b_2^{(4)}$ | $b_3^{(4)}$ | $b_4^{(4)}$ |

The information bits of the matrix are denoted as $b_i^{(j)}$, where i denotes the order of the bit in each row and (j) denotes the row number. The matrix is of the form $k_2 \times k_1$ and the matrix of table 1 is hereafter referred to as a $k_2 \times k_1$ information matrix.

In block 204, rows of the information matrix are encoded for generating a base code matrix. The encoding is typically carried out by using a cyclic code $C(n_1,k_1)$, where $n_1$ denotes the number of bits of the resulting codeword and $k_1$ denotes the number of original information bits from which the codeword is formed. This matrix is hereafter referred to as a $k_2 \times n_1$ base code matrix.

Similarly to the information matrix, in the base code matrix the coded bits are denoted as $c_i^{(j)}$, where i denotes the order of a coded bit in each row and (j) denotes the row number. An example of the base code matrix is shown below:

TABLE 2

| $c_1^{(1)}$ | $c_2^{(1)}$ | $c_3^{(1)}$ | $c_4^{(1)}$ | $c_5^{(1)}$ | $c_6^{(1)}$ | $c_7^{(1)}$ |
|---|---|---|---|---|---|---|
| $c_1^{(2)}$ | $c_2^{(2)}$ | $c_3^{(2)}$ | $c_4^{(2)}$ | $c_5^{(2)}$ | $c_6^{(2)}$ | $c_7^{(2)}$ |
| $c_1^{(3)}$ | $c_2^{(3)}$ | $c_3^{(3)}$ | $c_4^{(3)}$ | $c_5^{(3)}$ | $c_6^{(3)}$ | $c_7^{(3)}$ |
| $c_1^{(4)}$ | $c_2^{(4)}$ | $c_3^{(4)}$ | $c_4^{(4)}$ | $c_5^{(4)}$ | $c_6^{(4)}$ | $c_7^{(4)}$ |

In block 206, a parity check row is generated for the base code matrix to obtain an extended code matrix. The parity row is typically generated at the bottom of the matrix by computing parity check bits. The parity check bits can be computed for each column of the base code matrix (Table 2). A parity check bit can be computed as:

$$p_i^{(1)} = c_i^{(1)} \oplus c_i^{(2)} \oplus c_i^{(3)} \oplus c_i^{(4)}, \quad (1)$$

wherein coded bits are denoted as $c_i^{(j)}$, where i denotes the order of the bit in each row and (j) denotes the row number. The number of code bits vary according to the current practical implementation. The parity check bits for other columns are calculated in a similar manner. The operator $\oplus$ denotes a modulo-2 sum. The code may be denoted as $C(n_1,k_1) \times P(k_2+1,k_2)$ code.

Attention should be paid to the fact that the resulting code matrix (=a base code matrix with a parity row) is a special case of the code matrix of the general block turbo (product) code. This matrix is hereafter referred to as a $(k_2+1) \times n_1$ extended code matrix.

The extended code matrix with one parity check row of the example will then be:

TABLE 3

| $c_1^{(1)}$ | $c_2^{(1)}$ | $c_3^{(1)}$ | $c_4^{(1)}$ | $c_5^{(1)}$ | $c_6^{(1)}$ | $c_7^{(1)}$ |
|---|---|---|---|---|---|---|
| $c_1^{(2)}$ | $c_2^{(2)}$ | $c_3^{(2)}$ | $c_4^{(2)}$ | $c_5^{(2)}$ | $c_6^{(2)}$ | $c_7^{(2)}$ |
| $c_1^{(3)}$ | $c_2^{(3)}$ | $c_3^{(3)}$ | $c_4^{(3)}$ | $c_5^{(3)}$ | $c_6^{(3)}$ | $c_7^{(3)}$ |
| $c_1^{(4)}$ | $c_2^{(4)}$ | $c_3^{(4)}$ | $c_4^{(4)}$ | $c_5^{(4)}$ | $c_6^{(4)}$ | $c_7^{(4)}$ |
| $p_1^{(1)}$ | $p_2^{(1)}$ | $p_3^{(1)}$ | $p_4^{(1)}$ | $p_5^{(1)}$ | $p_6^{(1)}$ | $p_7^{(1)}$ |

In block 208, predetermined rows of the extended code matrix are shifted with respect to the preceding row in a predetermined way, and the following parity check row is generated for obtaining the following extended code matrix in such a way that there are more than two parity check rows in the following extended code matrix.

For example, if the parity check row to be generated is the second one, the rows are shifted one step (one bit position) to the left (or alternatively right). The first row of the matrix usually remains unshifted.

After the shifting operation, a new parity check row is generated in a similar manner to the first one (using equation 1). The extended code matrix of the example with two parity check rows will then be:

TABLE 4

| $c_1^{(1)}$ | $c_2^{(1)}$ | $c_3^{(1)}$ | $c_4^{(1)}$ | $c_5^{(1)}$ | $c_6^{(1)}$ | $c_7^{(1)}$ |
|---|---|---|---|---|---|---|
| $c_2^{(2)}$ | $c_3^{(2)}$ | $c_4^{(2)}$ | $c_5^{(2)}$ | $c_6^{(2)}$ | $c_7^{(2)}$ | $c_1^{(2)}$ |
| $c_3^{(3)}$ | $c_4^{(3)}$ | $c_5^{(3)}$ | $c_6^{(3)}$ | $c_7^{(3)}$ | $c_1^{(3)}$ | $c_2^{(3)}$ |
| $c_4^{(4)}$ | $c_5^{(4)}$ | $c_6^{(4)}$ | $c_7^{(4)}$ | $c_1^{(4)}$ | $c_2^{(4)}$ | $c_3^{(4)}$ |
| $p_5^{(1)}$ | $p_6^{(1)}$ | $p_7^{(1)}$ | $p_1^{(1)}$ | $p_2^{(1)}$ | $p_3^{(1)}$ | $p_4^{(1)}$ |
| $p_1^{(2)}$ | $p_2^{(2)}$ | $p_3^{(2)}$ | $p_4^{(2)}$ | $p_5^{(2)}$ | $p_6^{(2)}$ | $p_7^{(2)}$ |

Next, the following parity check rows are generated by using the shifting and the column-by-column parity-computation operations. Arrow 214 illustrates the loop of shifting and generating a new parity check row. The number of loops typically depends on the current requirements for a code.

In this example, when the ith parity row is generated, each row after the first row is shifted (i−1) steps either to the left or to the right with respect to the preceding row. That is to say that the rows of the extended code matrix are usually shifted one step less than the parity check row number to the left or to the right. After each shifting round, a parity check row is calculated in a similar way to the first parity check row (using equation 1).

Above, a regular shift pattern has been introduced, but in practice any shift pattern which is unique for generating each parity row can be used.

The maximum number of unique parity rows that can be generated with the embodiment is $n_1$. However, the actual number of parity check rows is determined on the basis of the dimensions of the overall code matrix and the desired bit error rate performance of the system.

Under certain restrictions (explained later in this application) for the horizontal code structure, each new parity check row increases the minimum distance of the MPCC code at least by the amount of $d_{min}$, where $d_{min}$ denotes the minimum Hamming distance of the linear cyclic horizontal code $C(n_1, k_1)$.

In block 210, rows of the following extended code matrix are derotated (de-rotate) for generating a multiple parity code matrix. The derotation is carried out in such a way that the original order (typically an increasing order) of coded bits is retained.

In another embodiment, also a row-wise parity check (calculating an additional parity column) is determined after the derotation for generating a multiple parity code matrix. This overall parity check is usually determined for each row of the following extended code matrix. Since the rows of the MPCC code matrix are code words of a cyclic code, the row-by-row parity computation will lead to a code matrix where each row is a codeword of an extended cyclic code.

In the example, the last following extended code matrix (this matrix is in this application called an extended MPCC code matrix) includes seven rows and eight columns altogether:

TABLE 5

| $c_1^{(1)}$ | $c_2^{(1)}$ | $c_3^{(1)}$ | $c_4^{(1)}$ | $c_5^{(1)}$ | $c_6^{(1)}$ | $c_7^{(1)}$ | $c_8^{(1)}$ |
|---|---|---|---|---|---|---|---|
| $c_1^{(2)}$ | $c_2^{(2)}$ | $c_3^{(2)}$ | $c_4^{(2)}$ | $c_5^{(2)}$ | $c_6^{(2)}$ | $c_7^{(2)}$ | $c_8^{(2)}$ |
| $c_1^{(3)}$ | $c_2^{(3)}$ | $c_3^{(3)}$ | $c_4^{(3)}$ | $c_5^{(3)}$ | $c_6^{(3)}$ | $c_7^{(3)}$ | $c_8^{(3)}$ |
| $c_1^{(4)}$ | $c_2^{(4)}$ | $c_3^{(4)}$ | $c_4^{(4)}$ | $c_5^{(4)}$ | $c_6^{(4)}$ | $c_7^{(4)}$ | $c_8^{(4)}$ |
| $p_1^{(1)}$ | $p_2^{(1)}$ | $p_3^{(1)}$ | $p_4^{(1)}$ | $p_5^{(1)}$ | $p_6^{(1)}$ | $p_7^{(1)}$ | $p_8^{(1)}$ |
| $p_1^{(2)}$ | $p_2^{(2)}$ | $p_3^{(2)}$ | $p_4^{(2)}$ | $p_5^{(2)}$ | $p_6^{(2)}$ | $p_7^{(2)}$ | $p_8^{(2)}$ |
| $p_1^{(3)}$ | $p_2^{(3)}$ | $p_3^{(3)}$ | $p_4^{(3)}$ | $p_5^{(3)}$ | $p_6^{(3)}$ | $p_7^{(3)}$ | $p_8^{(3)}$ |

The embodiment ends in block 212.

For example, if the rows of the MPCC code matrix are code words of the Hamming code, the rows of the extended MPCC code matrix are code words of the extended Hamming code.

The additional parity column of the extended MPCC code further improves the distance properties of the MPCC code The code words in a cyclic code typically have a composite length (i.e., the length of the code word can be presented as a product of two numbers) from which follows the limitation that $n_1$ has to be a prime number, except under certain strict requirements for the dimensions of the MPCC code matrix, Therefore, there is, in addition to the linearity and cyclicality, a further requirement for a horizontal code $C(n_1,k_1)$ most suitable for the purpose: the length $n_1$ has to be a prime number (a prime number is an integer number which is not divisible by any other integer number). This requirement contributes to avoiding some unfavourable combinations of parity row bits that would deteriorate distance properties of the MPCC code. Under these restrictions for the horizontal code structure, each new parity check row increases the minimum distance of the MPCC code at least by the amount of $d_{min}$, where $d_{min}$ denotes the minimum Hamming distance of the linear cyclic horizontal code $C(n_1,k_1)$. Therefore, the lower bound for the minimum Hamming distance of the MPCC code is obtained as follows:

$$d_{min}^{(MPCC)} = (m+1) \cdot d_{min}, \quad (2)$$

wherein m denotes the number of parity rows in MPCC code matrix, and $d_{min}$ denotes the minimum Hamming distance.

This lower bound is valid for all prime horizontal code lengths $n_1 > 31$.

For the lower bound to be valid for also non-prime code lengths, the minimum Hamming distance of the horizontal code has to be selected large enough or the dimensions of the code matrix have to be selected small enough to prevent the generation of unwanted zero parity check rows (parity check row where all parity bits are zero).

Next, in tables 6 and 7, some suitable cyclic codes for an MPCC code construction are presented.

TABLE 6

| n | k | $d_{min}$ | code |
|---|---|---|---|
| 31 | 26 | 3 | Hamming code |
| 31 | 21 | 5 | BCH code |
| 31 | 16 | 7 | BCH code |
| 31 | 11 | 11 | BCH code |
| 63 | 36 | 11 | BCH code |
| 63 | 30 | 13 | BCH code |
| 63 | 24 | 15 | BCH code |
| 63 | 18 | 21 | BCH code |
| 127 | 120 | 3 | Hamming code |
| 127 | 113 | 5 | BCH code |

TABLE 7

| n | k | $d_{min}$ | code |
|---|---|---|---|
| 127 | 106 | 7 | BCH code |
| 127 | 99 | 9 | BCH code |
| 127 | 92 | 11 | BCH code |
| 127 | 85 | 13 | BCH code |
| 127 | 78 | 15 | BCH code |
| 127 | 71 | 19 | BCH code |
| 127 | 64 | 21 | BCH code |
| 127 | 57 | 23 | BCH code |
| 127 | 50 | 27 | BCH code |
| 127 | 43 | 31 | BCH code |

Figure 3:
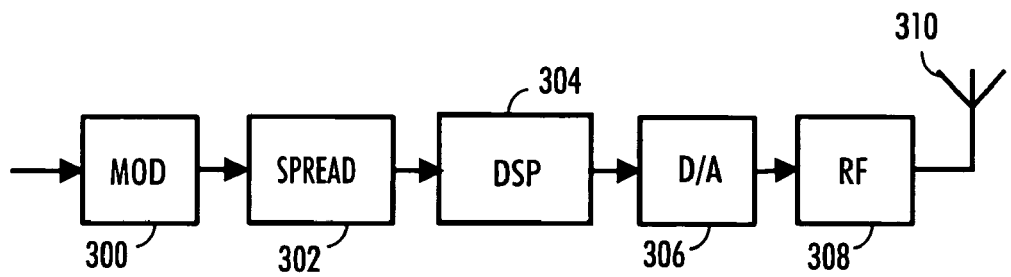
FIG. 3 illustrates an example of a transmitter.

FIG. 3 shows an example of a transmitter, which is typically placed in a network element such as a base station or in another communication device, such as a communication terminal without being restricted thereto. It is obvious for a person skilled in the art that the structure of the transmitter may vary according to the implementation.

In a transmitter, the signal is first modulated in block 300. Modulation means that a data stream modulates a carrier. The modulated signal characteristic may be frequency or phase for example. Modulation methods are known in the art and therefore they are not explained here in greater detail.

Because the system in FIG. 3 is a wide-band system, the signal is spread for example by multiplying it with a long pseudo-random code. Spreading is carried out in block 302. If the system is a narrow-band system, a spreading block will not be required.

In DSP (Digital Signal Processing) block 304, the signal to be transmitted is processed in several ways, for instance it is encrypted and/or coded. Hence the embodiment of the coding method described above is typically carried out in the DSP block.

The DSP block may also include modulation means of block 300 and spreading means of block 302.

Block 306 converts the signal into an analogue form. RF-parts in block 308 up-convert the signal to a carrier frequency, in other words a radio frequency, either via an intermediate frequency or straight to the carrier frequency. In this example, RF-parts also comprise a power amplifier which amplifiers the signal for a radio path.

The transmitter has an antenna 310. If a receiver and a transmitter use the same antenna, there is a duplex filter (not shown) to separate transmission and reception. The antenna may be an antenna array or a single antenna.

The disclosed functionalities of the described embodiments of the coding method can be advantageously implemented by means of software which typically locates in a Digital Signal Processor. The implementation solution can also be, for instance, an ASIC (Application Specific Integrated Circuit) component. A hybrid of these different implementations is also feasible.

Figure 4:
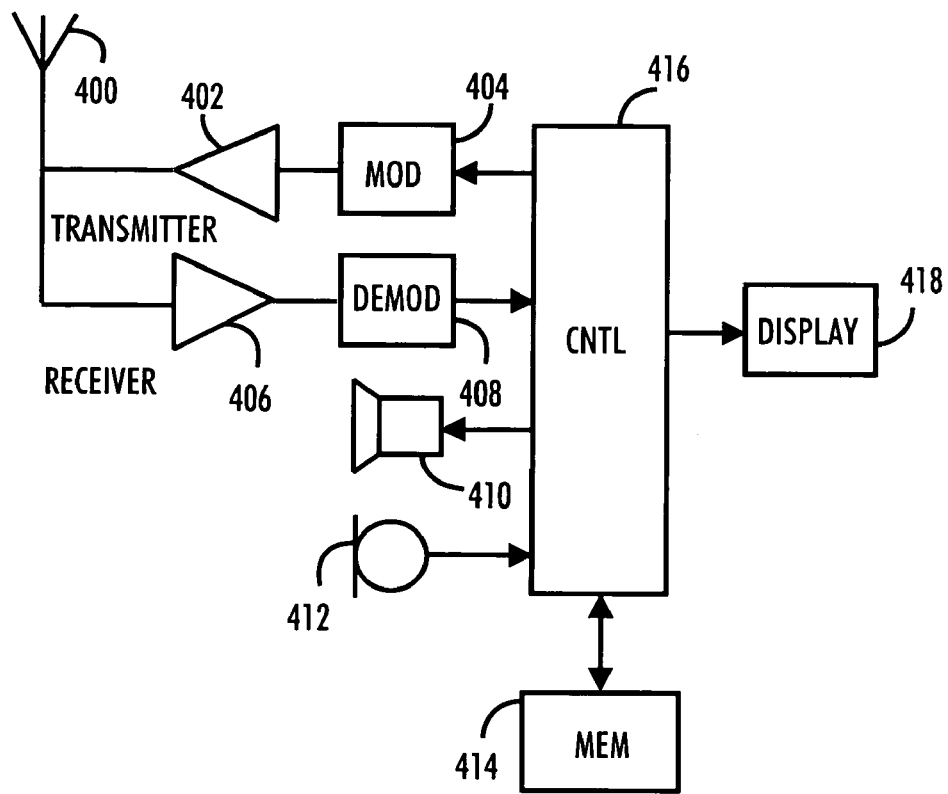
FIG. 4 shows an example of a terminal of a communication system.

FIG. 4 shows a simplified example of a communication terminal to which the embodiments of the invention can be applied. The terminal may be a mobile telephone or a microcomputer, for example, without being restricted thereto. It is obvious for a person skilled in the art that the structure of the terminal may vary according to the implementation.

The terminal comprises an antenna 400 with which signals are both transmitted and received via a duplex filter.

The terminal further comprises a transmitting RF (radio frequency) means 402 for a wireless communication system, to amplify and transmit a modulated signal to the antenna; a modulator 404 modulating the carrier wave by a data signal comprising the desired information in accordance with a selected modulation method; a receiving RF means 406 which amplifies the signal supplied from the antenna and down-converts the signal to a selected intermediate frequency or directly to base-band; and a demodulator 408 demodulating the received signal to enable a data signal to be separated from the carrier wave.

The terminal also comprises a controller block 416 comprising, for example, control means for controlling the operation of the different parts of the terminal and means for processing the user's speech or the data generated by the user, such as a Digital signal Processor. Hence the embodiment of the coding method described above is typically carried out in the DSP block.

The Digital Signal Processor has also coding (and decoding) means. In this example, the control means further comprises A/D converters converting an analogue signal into a digital one by sampling and quantizing the base-band signal.

Furthermore, in spread-spectrum systems, such as WCDMA, the spectrum of the signal is spread at the transmitter by means of a pseudo-random spreading code over a wide band and de-spread at the receiver, in an attempt to increase channel capacity.

The user interface of the terminal usually comprises a loudspeaker or an earpiece 410, a microphone 412, a display 418 and possibly a keypad and/or a joystick or a similar device. The user interface devices communicate with the control block.

The terminal typically also comprises several different memory elements that are shown as one functional block 414.

The disclosed functionalities of the described embodiments of the coding method can be advantageously implemented by means of software which typically locates in a Digital Signal Processor. The implementation solution can also be, for instance, an ASIC (Application Specific Integrated Circuit) component. A hybrid of these different implementations is also feasible.

Even though the invention is described above with reference to an example according to the accompanying drawings, it is clear that the invention is not restricted thereto but it can be modified in several ways within the scope of the appended claims.

We claim:

1. A method executable on a processor, the method comprising:
    arranging information bits in an information matrix;
    encoding rows of the information matrix for generating a base code matrix;
    generating a parity check row for the base code matrix to obtain an extended code matrix;
    shifting predetermined rows of the extended code matrix with respect to a preceding row in a predetermined way and generating a following parity check row for obtaining a following extended code matrix in such a way that there are more than two parity check rows in the following extended code matrix; and
    derotating rows of the following extended code matrix for generating a multiple parity code matrix, the derotating to provide an order of coded bits corresponding to the extended code matrix.

2. The method of claim 1, further comprising carrying out the encoding by selecting a linear cyclic code as a horizontal code.

3. The method of claim 1, further comprising carrying out the encoding by selecting as a horizontal code a linear cyclic code having a length that is a prime number.

4. The method of claim 1, further comprising shifting the rows of the extended code matrix one step less than a parity check row number to a left or to a right and a first row of a matrix remaining unshifted.

5. The method of claim 1, further comprising carrying out the shifting for increasing a minimum Hamming distance of a code to be generated.

6. The method of claim 1, further comprising carrying out the derotation in such a way that an original order of coded bits is retained.

7. The method of claim 1, further comprising generating an additional parity check column by a row-wise computation.

8. An apparatus comprising:
    means for arranging information bits in an information matrix;
    means for encoding rows of the information matrix for generating a base code matrix;
    means for generating a parity check row for the base code matrix to obtain an extended code matrix;
    means for shifting predetermined rows of the extended code matrix with respect to a preceding row in a predetermined way and generating a following parity check row for obtaining a following extended code matrix in such a way that there are more than two parity check rows in the following extended code matrix; and
    means for derotating rows of the following extended code matrix for generating a multiple parity code matrix, the derotating to provide an order of coded bits corresponding to the extended code matrix.

9. The component of claim 8, further comprising means for shifting the rows of the extended code matrix one step less than a parity check row number to a left or to a right a first row of a matrix remaining unshifted.

10. The component of claim 8, further comprising means for carrying out the shifting for increasing a minimum Hamming distance of a code to be generated.

11. The component of claim 8, further comprising means for carrying out the derotation in such a way that the original order of the coded bits is retained.

12. The component of claim 8, further comprising means for generating an additional parity check column by a row-wise computation.

13. A network element comprising:
    means for arranging information bits in an information matrix;
    means for encoding rows of the information matrix for generating a base code matrix;
    means for generating a parity check row for the base code matrix to obtain an extended code matrix;
    means for shifting predetermined rows of the extended code matrix with respect to a preceding row in a predetermined way and generating a following parity check row for obtaining a following extended code matrix in such a way that there are more than two parity check rows in the following extended code matrix;
    means for derotating rows of the following extended code matrix for generating a multiple parity code matrix, the derotating to provide an order of coded bits corresponding to the extended code matrix; and
    means for adapting an encoded signal for a radio path.

14. The network element of claim 13, further comprising means for shifting the rows of the extended code matrix one step less than a parity check row number to a left or to a right a first row of a matrix remaining unshifted.

15. The network element of claim 13, further comprising means for carrying out the shifting for increasing a minimum Hamming distance of a code to be generated.

16. The network element of claim 13, further comprising means for carrying out the derotation in such a way that an original order of coded bits is retained.

17. The network element of claim 13, further comprising means for generating an additional parity check column by a row-wise computation.

18. A communication terminal comprising:
    means for arranging information bits in an information matrix;
    means for encoding rows of the information matrix for generating a base code matrix;
    means for generating a parity check row for the base code matrix to obtain an extended code matrix;
    means for shifting predetermined rows of the extended code matrix with respect to a preceding row in a predetermined way and generating a following parity check row for obtaining a following extended code matrix in such a way that there are more than two parity check rows in the following extended code matrix;

means for derotating rows of the following extended code matrix for generating a multiple parity code matrix, the derotating to provide an order of coded bits corresponding to the extended code matrix; and means for adapting an encoded signal for a radio path.

19. The communication terminal of claim 18, further comprising means for shifting the rows of the extended code matrix one step less than a parity check row number to a left or to a right a first row of a matrix remaining unshifted.

20. The communication terminal of claim 18, further comprising means for carrying out the shifting for increasing a minimum Hamming distance of the code to be generated.

21. The communication terminal of claim 18, further comprising means for carrying out the derotation in such a way that an original order of coded bits is retained.

22. The communication terminal claim 18, further comprising means for generating an additional parity check column by a row-wise computation.

23. An apparatus comprising a processor configured to:
arrange information bits in an information matrix;
encode rows of the information matrix for generating a base code matrix;
generate a parity check row for the base code matrix to obtain an extended code matrix;
shift predetermined rows of the extended code matrix with respect to a preceding row in a predetermined way and generating a following parity check row for obtaining a following extended code matrix in such a way that there are more than two parity check rows in the following extended code matrix; and
derotate rows of the following extended code matrix for generating a multiple parity code matrix, the derotating to provide an order of coded bits corresponding to the extended code matrix.

24. An apparatus comprising a processor configured to:
arrange information bits in an information matrix;
encode rows of the information matrix for generating a base code matrix;
generate a parity check row for the base code matrix to obtain an extended code matrix;
shift predetermined rows of the extended code matrix with respect to a preceding row in a predetermined way and generating a following parity check row for obtaining a following extended code matrix in such a way that there are more than two parity check rows in the following extended code matrix;
derotate rows of the following extended code matrix for generating a multiple parity code matrix, the derotating to provide an order of coded bits corresponding to the extended code matrix; and
adapt an encoded signal for a radio path.

25. An apparatus comprising a processor configured to:
arrange information bits in an information matrix;
encode rows of the information matrix for generating a base code matrix;
generate a parity check row for the base code matrix to obtain an extended code matrix;
shift predetermined rows of the extended code matrix with respect to a preceding row in a predetermined way and generating a following parity check row for obtaining a following extended code matrix in such a way that there are more than two parity check rows in the following extended code matrix;
derotate rows of the following extended code matrix for generating a multiple parity code matrix, the derotating to provide an order of coded bits corresponding to the extended code matrix; and
adapt an encoded signal for a radio path.

26. A computer-readable storage medium including a computer program of instructions which when executed provides a process, the process comprising:
arranging information bits in an information matrix;
encoding rows of the information matrix for generating a base code matrix;
generating a parity check row for the base code matrix to obtain an extended code matrix;
shifting predetermined rows of the extended code matrix with respect to a preceding row in a predetermined way and generating a following parity check row for obtaining a following extended code matrix in such a way that there are more than two parity check rows in the following extended code matrix; and
derotating rows of the following extended code matrix for generating a multiple parity code matrix, the derotating to provide an order of coded bits corresponding to the extended code matrix.

* * * * *

UNITED STATES PATENT AND TRADEMARK OFFICE
CERTIFICATE OF CORRECTION

| | |
|---|---|
| PATENT NO. | : 7,634,704 B2 |
| APPLICATION NO. | : 11/400312 |
| DATED | : December 15, 2009 |
| INVENTOR(S) | : Nordman et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 857 days.

Signed and Sealed this

Twenty-first Day of December, 2010

David J. Kappos
*Director of the United States Patent and Trademark Office*